United States Patent
Wei et al.

(10) Patent No.: US 8,982,347 B2
(45) Date of Patent: Mar. 17, 2015

(54) ALIGNMENT MARK DEFORMATION ESTIMATING METHOD, SUBSTRATE POSITION PREDICTING METHOD, ALIGNMENT SYSTEM AND LITHOGRAPHIC APPARATUS

(71) Applicant: ASML Netherlands N.V., Veldhoven (NL)

(72) Inventors: Xiuhong Wei, Eindhoven (NL); Franciscus Godefridus Casper Bijnen, Valkenswaard (NL); Richard Johannes Franciscus Van Haren, Waalre (NL); Marcus Adrianus Van De Kerkhof, Helmond (NL); Everhardus Cornelis Mos, Best (NL); Hubertus Johannes Gertrudus Simons, Venlo (NL); Remi Daniel Marie Edart, Eindhoven (NL); David Deckers, Schilde (BE); Nicole Schoumans, 's-Hertogenbosch (NL); Irina Lyulina, Son (NL)

(73) Assignee: ASML Netherlands B.V., Veldhoven (NL)

( * ) Notice: Subject to any disclaimer, the term of this patent is extended or adjusted under 35 U.S.C. 154(b) by 167 days.

(21) Appl. No.: 13/667,199

(22) Filed: Nov. 2, 2012

(65) Prior Publication Data
US 2013/0141723 A1 Jun. 6, 2013

Related U.S. Application Data

(60) Provisional application No. 61/566,349, filed on Dec. 2, 2011.

(51) Int. Cl.
G01B 11/00 (2006.01)
G01B 11/27 (2006.01)

(52) U.S. Cl.
CPC .............. *G01B 11/272* (2013.01); *G01B 11/27* (2013.01)
USPC ............................ 356/400; 356/399; 356/401

(58) Field of Classification Search
CPC ............ H01L 2224/8013; H01L 2224/80132; G01B 11/272; G01B 11/27; G01B 11/00
USPC .................................................. 356/399–401
See application file for complete search history.

(56) References Cited

U.S. PATENT DOCUMENTS 6,552,775 B1 * 4/2003 Yanagihara et al. ............ 355/55
7,414,722 B2 8/2008 Van Bilsen
(Continued)

FOREIGN PATENT DOCUMENTS

| JP | 2006-012867 A | 1/2006 |
| JP | 2007-053374 A | 3/2007 |
| JP | 2009-239077 A | 10/2009 |

OTHER PUBLICATIONS

English-Language Abstract for Japanese Patent Publication No. 2006-012867 A, published Jan. 12, 2006; 1 page.

*Primary Examiner* — Tarifur Chowdhury
*Assistant Examiner* — Isiaka Akanbi
(74) *Attorney, Agent, or Firm* — Sterne, Kessler, Goldstein & Fox P.L.L.C.

(57) ABSTRACT

A method is used to estimate a value representative for a level of alignment mark deformation on a processed substrate using an alignment system. The alignment sensor system is able to emit light at different measuring frequencies to reflect from an alignment mark on the substrate and to detect a diffraction pattern in the reflected light in order to measure an alignment position of the alignment mark. The two or more measuring frequencies are used to measure an alignment position deviation per alignment mark associated with each of the two or more measuring frequencies relative to an expected predetermined alignment position of the alignment mark. A value is determined representative for the spread in the determined alignment position deviations per alignment mark in order to estimate the level of alignment mark deformation.

17 Claims, 2 Drawing Sheets

(56) References Cited

U.S. PATENT DOCUMENTS 8,089,612 B2 1/2012 Matsumoto et al.
2004/0257572 A1* 12/2004 Stacker .................... 356/401
2005/0147902 A1* 7/2005 Van Der Schaar et al. ..... 430/22
2007/0176128 A1* 8/2007 Van Bilsen et al. ........... 250/548

* cited by examiner

ALIGNMENT MARK DEFORMATION ESTIMATING METHOD, SUBSTRATE POSITION PREDICTING METHOD, ALIGNMENT SYSTEM AND LITHOGRAPHIC APPARATUS

BACKGROUND

1. Field of the Invention

The present invention relates to a method for estimating the alignment mark deformation of a processed wafer, a method to estimate a relationship between alignment mark deformation and overlay errors, a method for predicting a position of a desired point on a processed wafer, an alignment system capable of performing one or more of the methods, and a lithographic apparatus comprising such a alignment system.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

With the aid of a lithographic apparatus, different mask patterns are successively imaged at a precisely aligned position onto the substrate. The substrate may undergo physical and chemical changes between the successive images that have been aligned with each other. The substrate is removed from the apparatus after it has been exposed with the image of at least one mask pattern, and, after it has undergone the desired process steps, the substrate is placed back in order to expose it with an image of a further mask pattern, and so forth, while it must be ensured that the images of the further mask pattern and the subsequent mask patterns are positioned accurately with respect to the at least one already exposed image on the substrate. To this end, the substrate is provided with alignment marks to provide a reference location on the substrate, and the lithographic apparatus is provided with an alignment system to measure the alignment position of the alignment marks. By measuring the alignment position of the alignment marks, in principle the position of every point on the substrate can be predicted, i.e., the location of a previously exposed target portion can be calculated and the lithographic apparatus can be controlled to expose a successive target portion on top of the previously exposed target portion.

Usually, the alignment marks on the substrate are diffraction gratings. The alignment system then comprises an alignment sensor system with a light source to emit light towards the grating and a detector to detect the diffraction pattern in the reflected light, i.e., sub-beams diffracted in a first, third and/or higher order are used, in order to determine the position of the grating.

The processing of the wafer may render the alignment mark asymmetrical, so that the measured point of gravity of the grating no longer coincides with the geometrical center of the grating. This is called alignment mark deformation. Hence, when the alignment position after processing is measured, the alignment mark deformation introduces measurement errors when predicting the displacement in a desired point of the substrate.

If the predicted displacement in a desired point of the substrate is used to expose the substrate with a next pattern, the measurement errors result in a poor overlay performance.

SUMMARY

It is desirable to provide a lithographic apparatus in which the overlay performance is improved. It is further desirable to provide a lithographic apparatus in which the displacement in every point of the substrate can be predicted more accurately.

According to an embodiment of the invention there is provided a method to estimate a value representative for a level of alignment mark deformation on a processed substrate using an alignment system comprising an alignment sensor system that is able to emit light at different measuring frequencies to reflect from an alignment mark on the substrate and to detect a diffraction pattern in the reflected light in order to measure an alignment position of the alignment mark, the method comprising the following steps: a) providing a substrate with at least N alignment marks, wherein each alignment mark is provided in a predetermined alignment position; b) processing the substrate; c) for N alignment marks, measuring an alignment position after processing of the substrate using the alignment sensor system, wherein for two or more measuring frequencies: d) light is emitted at the respective two or more measuring frequencies towards the alignment mark; e) for each of the two or more measuring frequencies, a corresponding diffraction pattern in the from the alignment mark reflected light is detected; and wherein the alignment system determines an alignment position from the detected two or more diffraction patterns, such that for each of the N alignment marks a set of alignment positions is obtained corresponding to the two or more measuring frequencies of the alignment sensor system, and wherein the method further comprises the following steps: f) for each of the N alignment marks, determining an alignment position deviation for each alignment position of the set of alignment positions by comparing the alignment positions with the predetermined alignment position, thereby obtaining a set of alignment position deviations per alignment mark; g) for each of the N alignment marks, determining a value which is representative for the spread in the set of alignment position deviations to estimate the level of deformation of the alignment mark.

In an embodiment, the value representative for the spread in the obtained alignment position deviations is the variance of the set of alignment position deviations.

In an embodiment, the value representative for the spread in the obtained alignment position deviations is the standard deviation of the set of alignment position deviations.

In an embodiment, the alignment position is measured using three, four or more measuring frequencies.

According to another embodiment of the invention, there is provided a method to predict the position of a desired point on a processed substrate, the method comprising the following steps: a) providing a substrate with at least N alignment marks, wherein each alignment mark is provided in a predetermined alignment position; b) processing the substrate; c) for N alignment marks, measuring an alignment position after processing of the substrate; d) for each of the N alignment marks, determining an alignment position deviation by comparing the measured alignment position with the predetermined alignment position; e) for each of the N alignment marks, determining a value representative for the level of alignment mark deformation; and f) for each of the N alignment marks, determining a weighing factor based on the value, such that the weighing factor is high for alignment marks having minimal alignment mark deformation and low for alignment marks having a relatively large alignment mark deformation; and g) predicting the position of a desired point on the substrate by applying a position predicting model having the weighed alignment position deviations as input.

In an embodiment, use is made of an alignment system comprising an alignment sensor system that is each able to emit light at different measuring frequencies to reflect from an alignment mark on the substrate and to detect a diffraction pattern in the reflected light in order to measure an alignment position of the alignment mark, and wherein the alignment position of each of the N alignment marks after processing of the substrate is measured using the alignment sensor system, wherein for two or more measuring frequencies: light is emitted at the respective two or more measuring frequencies towards the alignment mark; for each of the two or more measuring frequencies, a corresponding diffraction pattern in the from the alignment mark reflected light is detected; wherein the alignment system determines a preferred measuring frequency for each of the N alignment marks that gives the best result, e.g., has the largest signal intensity, and wherein the alignment system determines an alignment position from the detected diffraction pattern associated with the preferred measuring frequency.

In an embodiment, use is made of an alignment system comprising an alignment sensor system that is each able to emit light at different measuring frequencies to reflect from an alignment mark on the substrate and to detect a diffraction pattern in the reflected light in order to measure an alignment position of the alignment mark, and wherein the alignment position of each of the N alignment marks after processing of the substrate is measured using the alignment sensor system, wherein for two or more measuring frequencies: light is emitted at the respective two or more measuring frequencies towards the alignment mark; for each of the two or more measuring frequencies, a corresponding diffraction pattern in the from the alignment mark reflected light is detected; wherein the alignment system determines an alignment position from the detected two or more diffraction patterns, such that for each of the N alignment marks a set of alignment positions is obtained corresponding to the two or more measuring frequencies of the alignment sensor system, and wherein for each of the N alignment marks, an alignment position deviation is determined for each alignment position of the set of alignment positions by comparing the alignment positions with the predetermined alignment position, thereby obtaining a set of alignment position deviations per alignment mark and wherein the alignment system determines a preferred measuring frequency for each of the N alignment marks that gives the best result, e.g., has the largest signal intensity, wherein the information of the preferred measuring frequency is used to determine the alignment position and alignment position deviation for the alignment mark, and wherein the value representative for the level of mark deformation is determined by determining a value which is representative for the spread in the set of alignment position deviations to estimate the level of deformation of the alignment mark.

In an embodiment, in case of a value that increases with increasing alignment mark deformation, on a scale of zero to one, the weighing factor is zero when the value is above a predetermined threshold and is one when the value is below the predetermined threshold, and wherein in case of a value that decreases with increasing alignment mark deformation, the weighing factor is one when the value is above a predetermined threshold and is zero when the value is below the predetermined threshold.

In an embodiment, the weighing factor is also dependent on the signal intensity of the preferred alignment sensor, wherein preferably the weighing factor is zero when the intensity is below a predetermined threshold and one when the intensity is above the predetermined threshold.

In an embodiment, for each of the N alignment marks a shape factor is determined representative for the undesired scattering of light from the alignment mark, wherein the weighing factor is also dependent on the shape factor, and wherein preferably the weighing value is zero when the undesired scattering of light is above a predetermined threshold and one when the scattering of light is below the predetermined threshold.

In an embodiment, the weighing factor is dependent on an alignment mark deformation distribution, preferably by being dependent on the sum of the ratio between the distance to other alignment marks and the value of the other alignment marks divided by the value of the alignment mark the weighing factor is determined for.

According to a further embodiment of the invention, there is provided an alignment system comprising an alignment sensor system provided with multiple light sources to emit light at different measuring frequencies towards an alignment mark on a substrate, and at least one detector to detect a diffraction pattern in light reflected from the alignment mark, the alignment system further being provided with a processing unit in connection with the at least one detector of the alignment sensor system and configured to perform one or more of the method steps of the method according to the invention.

In an embodiment, the processing unit is configured to perform at least the method steps: f) for each of the N alignment marks, determining a weighing factor based on the value, such that the weighing factor is high for alignment marks having minimal alignment mark deformation and low for alignment marks having a relatively large alignment mark deformation; and g) predicting the position of a desired point on the substrate by applying a position predicting model having the weighed alignment position deviations as input.

In an embodiment, two or more measuring frequencies share a common detector.

According to yet another embodiment of the invention, there is provided a lithographic apparatus comprising an alignment system according to the invention.

According to another embodiment of the invention, there is provided a method to estimate the level of alignment mark deformation on a processed substrate using an alignment system with multiple alignment sensors that are each able to emit light at a measuring frequency different from the other alignment sensors to reflect from an alignment mark on the substrate and to detect a diffraction pattern in the reflected light in order to measure an alignment position of the alignment mark, the method comprising the following steps: a) providing a substrate with multiple alignment marks, wherein each alignment mark is provided in a predetermined position;

b) processing the substrate; c) for each alignment mark, measuring an alignment position after processing of the substrate using two or more alignment sensors of the alignment system, wherein each alignment sensor: d) emits light at its own measuring frequency towards the alignment mark; e) detects a diffraction pattern in the from the alignment mark reflected light; and wherein the alignment system determines an alignment position from the associated detected diffraction pattern, such that for each alignment mark a set of alignment positions is obtained corresponding to the two or more alignment sensors of the alignment system, and wherein the method further comprises the following steps: f) for each alignment mark, determining a value which is representative for the spread in the set of alignment positions to estimate the level of deformation of the alignment mark.

According to a further embodiment of the invention, there is provided a method comprising the following steps: a) providing M substrates, wherein M is at least two; b) transferring a first pattern to each of the M substrates, the first pattern including at least N alignment marks, wherein each alignment mark has a respective predefined nominal position within the first pattern, and wherein N is at least two; c) processing the M substrates; d) for each substrate, measuring a position of N alignment marks; e) determining a first mark deformation value for each of the measured alignment marks that is representative for the level of alignment mark deformation of the corresponding alignment mark; f) determining an alignment mark displacement for each of the measured alignment marks by comparing the respective nominal position of an alignment mark with the respective measured position of the alignment mark; g) for each substrate, fitting a first model to the N alignment mark displacements to obtain at least one alignment model parameter per substrate; h) transferring a second pattern to each of the M substrates using the respective at least one alignment model parameter in order to align the second pattern with respect to the first pattern; i) for each substrate, measuring at least two overlay errors by measuring a relative position of the first pattern with respect to the second pattern at distinct locations on the substrate, wherein an overlay error is representative for a displacement of the second pattern relative to a desired alignment between first and second pattern at the respective location; j) for each substrate, fitting the first model to the respective N first mark deformation values to obtain at least one first mark deformation model parameter per substrate; k) for each substrate, fitting the first model to the respective multiple overlay errors to obtain at least one overlay error model parameter per substrate; l) determining a relationship between the obtained first mark deformation model parameters and the obtained overlay error model parameters in order to determine a relationship between first mark deformation values and overlay errors.

In an embodiment, the relationship between the obtained first mark deformation model parameters and the obtained overlay error model parameters is found by solving a set of equations, wherein each equation defines an overlay error model parameter as a function of a corresponding first mark deformation model parameter.

In an embodiment, the method comprises the following steps: e2) determining a second mark deformation value for each of the measured alignment marks that is representative for the level of alignment mark deformation of the corresponding alignment mark, wherein the determination of the second mark deformation value is based on other information than the determination of the first mark deformation value; j2) for each substrate, fitting the first model to the respective N second mark deformation values to obtain at least one second mark deformation model parameter per substrate; wherein step l) is replaced by the following step: l') determining a relationship between the obtained first and second mark deformation model parameters and the obtained overlay error model parameters in order to determine a relationship between first and second mark deformation values and overlay errors.

In an embodiment, the relationship between the obtained first and second mark deformation model parameters and the obtained overlay error model parameters is found by solving a set of equations, wherein each equation defines an overlay error model parameter as a function of a corresponding first mark deformation model parameter and a corresponding second mark deformation model parameter.

In an embodiment, M is larger than the number of parameters of the set of equations, and wherein N is larger than the number of parameters of the first model.

In an embodiment, the method comprises the following steps: m) calculating at least one alignment model parameter compensation value based on the relationship between the obtained first mark deformation model parameters and the obtained overlay error model parameters to compensate for mark deformation induced overlay errors; n) transferring a first pattern to a further substrate, the first pattern including at least N alignment marks, wherein each alignment mark has a respective predefined nominal position within the first pattern; o) processing the further substrate; p) measuring a position of N alignment marks on the further substrate; q) determining an alignment mark displacement for each of the N measured alignment marks of the further substrate by comparing the respective nominal position of an alignment mark with the respective measured position of the alignment mark; r) fitting the first model to the N alignment mark displacements of the further substrate to obtain at least one alignment model parameter associated with the further substrate; s) combining the at least one alignment model parameter with the at least one calculated alignment model parameter compensation value to obtain at least one compensated alignment model parameter; t) transferring a second pattern to the further substrate using the at least one compensated alignment model parameter in order to align the second pattern with respect to the first pattern.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
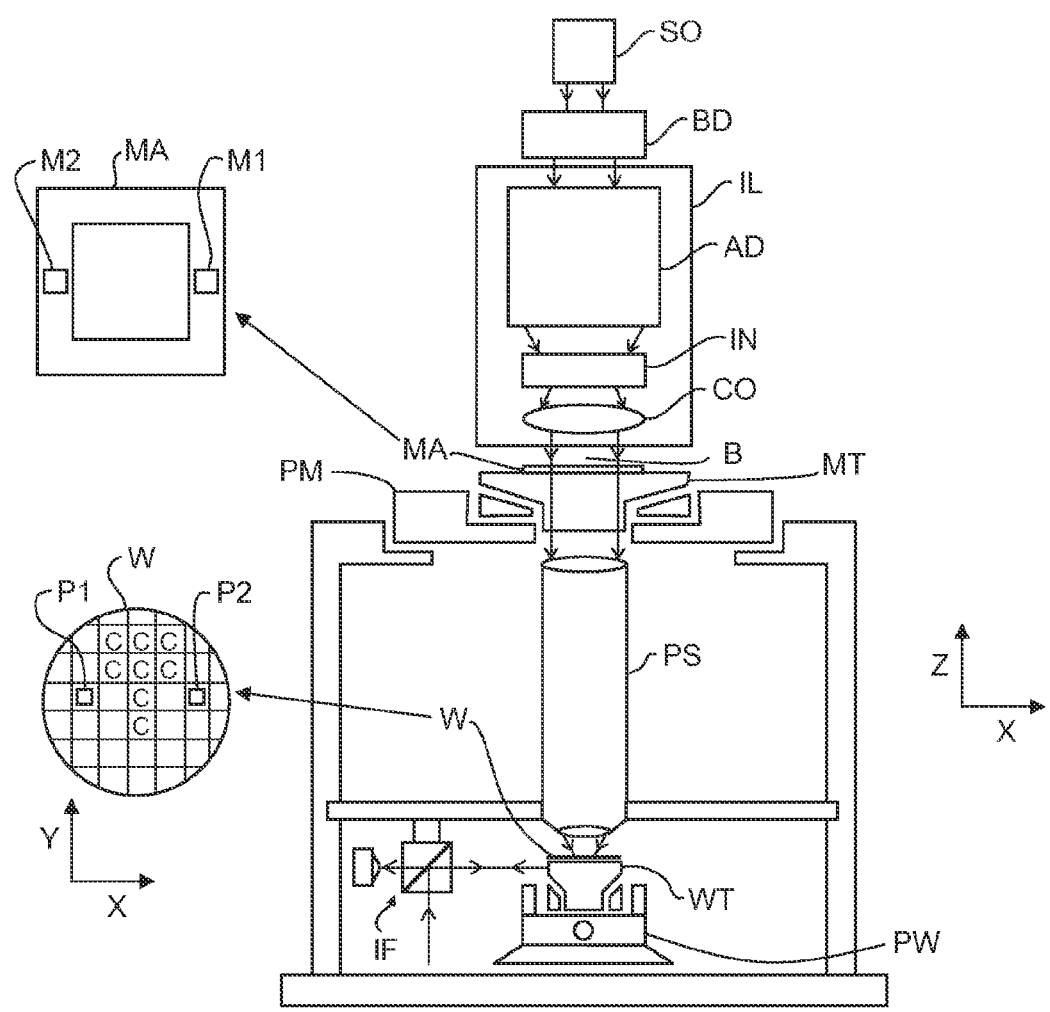
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is-reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
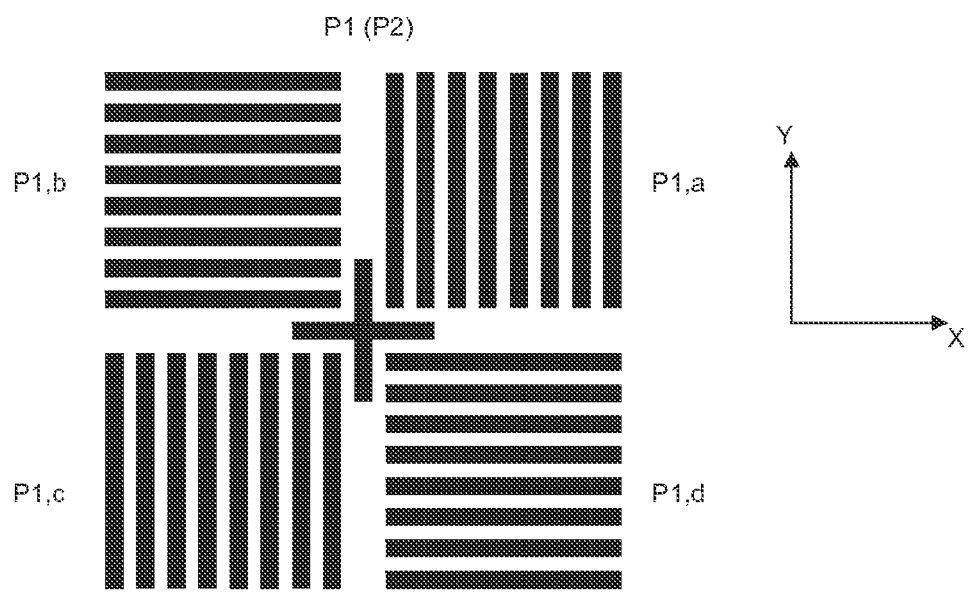
FIG. 2 depicts an embodiment of an alignment mark.

Alignment mark P1 of FIG. 1 is shown in more detail in FIG. 2. Alignment mark P2 is identical to this alignment mark P1 and thus not shown separately. The alignment mark P1 is a phase grating having a 2×2 array of sub-gratings P1,a, P1,b, P1,c and P1,d, wherein two, P1,a and P1,c, serve for alignment in the X direction and the other one, P1,b and P1,d, serve for alignment in the Y direction. The two sub-gratings P1,b and P1,c may have a grating period, for example 8 micrometer, where the sub-gratings P1,a and P1,d may have a grating period of 8.8 micrometer. By choosing different grating periods, the capture range of the alignment system can be enlarged.

Figure 3:
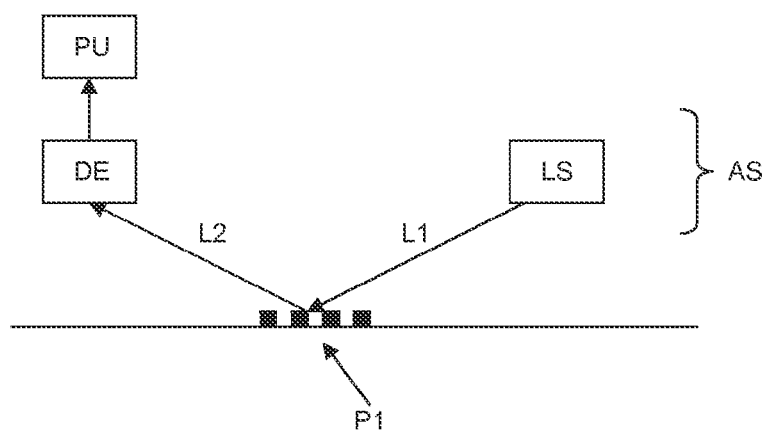
FIG. 3 depicts schematically an alignment system according to another embodiment of the invention.

The position of the substrate alignment marks P1, P2 may be measured using an alignment system with alignment sensor system AS (see FIG. 3). The alignment sensor system AS comprises a light source LS that emits light L1 towards an alignment mark P1. Due to the gratings of the alignment mark the reflected light L2 is diffracted. The diffraction pattern in the reflected light is measured using an appropriate detector DE. From the diffraction pattern, the position of the alignment mark may be derived by a processing unit PU.

The alignment sensor system is preferably provided with multiple light sources which preferably share the common processing unit PU. The multiple light sources are advantageous, because the signal strength of monochromatic light reflected from a phase grating varies periodically with the depth of the grooves of the gratings. Processing of the wafer may influence the depth of the grooves which can render grating marks undetectable in some cases or provide a weak signal in other cases when using a single alignment sensor. By providing multiple light sources each emitting light at a separate wavelength, i.e., measuring frequency, chances are improved that at least one of the measuring frequencies provides a sufficient signal strength that can be used for alignment position determination. Current alignment systems use two or four measuring frequencies all sharing the same processing unit which processes the signals coming from the respective detectors. However, other numbers of measuring frequencies are also envisaged. It is further noted that using the multiple measuring frequencies in practice may be implemented in different ways. Even multiple separate sensors may be provided to this end.

In an embodiment, two or more light sources of the alignment sensor system at least partially share a common detector DE in the same manner as the processing unit PU.

The methods described below to estimate the level of alignment mark deformation and to determine the position of a desired point on the substrate are based on the insight that the influence from the alignment mark deformation is different for each of the measuring frequencies and thus that the spread in the set of alignment position deviation determinations or the alignment position determinations can be used as an estimate for the level of alignment mark deformation, wherein the larger the spread the more the alignment mark is deformed. This spread can be used as a mark deformation value to be used to weigh information related to the alignment marks or to estimate a relationship between mark deformation and overlay error. Besides the spread, the difference between alignment position deviations of different alignment sensors may also be used as a mark deformation value representative for the level of alignment mark deformation.

It will be understood by the skilled person that any value that can be representative for the level of alignment mark deformation can be used as a mark deformation value. In fact, multiple different values may be used at the same time as a mark deformation value representative for the level of alignment mark deformation. In that case it may be preferable to determine first which value is most representative for the level of alignment mark deformation, before using this value in a method according to the invention.

The processing of a wafer starts with providing an unprocessed wafer with multiple alignment marks distributed across the wafer at predetermined positions, i.e., each alignment mark is provided in its own unique predetermined position.

The position of an alignment mark can be measured by illuminating the alignment mark with light at different measuring frequencies using the alignment sensor system as described in relation to FIG. 3. The light will reflect of the alignment mark and be diffracted. The diffraction pattern in the reflected light is detected by the respective detectors and a signal representative for the alignment position is derived therefrom. The signal strength for each measuring frequency is compared with the signal strength of the other measuring frequency to determine a preferred measuring frequency for each alignment mark. The preferred measuring frequency is then used to determine the alignment position of the alignment mark. In this way, it is ensured that the best signal from signal strength point of view is used for determining the alignment position.

When the alignment positions of the alignment marks are determined, in principle the position of every point on the wafer can be predicted and this information is used to transfer a pattern to the wafer as described above. After transferring one or more patterns to the wafer, the wafer is removed from the lithographic apparatus and undergoes physical and/or chemical processes. After processing of the wafer, the wafer is returned to the lithographic apparatus for transferring a further pattern to the wafer. This pattern has to be aligned properly with the already present pattern or patterns on the wafer. It is therefore important to know the exact position of every desired point on the wafer after it has returned to the lithographic apparatus, wherein every desired position is to be interpreted that enough position information is obtained about the substrate such that successive patterns can be aligned with respect to each other.

The alignment position of each alignment mark after processing is again determined using the alignment system as described above. The outcome of the alignment sensor system is compared with the expected alignment position, i.e., the predetermined locations of the alignment marks, in order to determine an alignment position deviation associated with the respective measuring frequency. Alignment position deviation may also be referred to as alignment mark displacement. The alignment position deviation is usually determined in two orthogonal directions (X and Y). The result is thus a set of alignment position deviations per alignment mark. By determining a preferred measuring frequency, e.g., based on signal intensity, the alignment position deviation corresponding to this preferred measuring frequency can be used in determining the position of a desired point on the wafer.

If alignment mark deformation is present this will introduce measurement errors in the determination of the alignment position deviation, wherein the measurement error for each measuring frequency is found to be different. The level of alignment mark deformation can then be estimated by determining a value for each alignment mark which is representative for the spread in the obtained set of alignment position deviations associated with the alignment mark. In principle, the larger the spread in alignment position deviations, the more deformed the alignment mark is. Alternatively, the level of alignment mark deformation can be estimated by determining a value for each alignment mark which is representative for the spread in the obtained set of alignment positions associated with the alignment mark. An advantage of the latter is that it requires one step less, as the alignment position deviations do not have to be determined. However, in most lithographic apparatus, the alignment position deviations have to be determined anyhow, so that the advantage is minimal in most cases. It is also possible that the spread in the set of alignment positions corresponds to the spread in the set of alignment position deviations and that thus it does not matter which spread is determined.

The value representative for the spread may for instance be obtained by calculating the variance or the standard deviation of the set of alignment position deviations or alignment positions. As an example, when four measuring frequencies are used, the value may be calculated using the following equation:

$$V=0{,}25\sqrt{(D_{f1}-\overline{D})^2+(D_{f2}-\overline{D})^2+(D_{f3}-\overline{D})^2+(D_{f4}-\overline{D})^2}$$

where $D_{f1}$-$D_{f4}$ are the alignment position deviations obtained for respective measuring frequencies f1-f4, $\overline{D}$ is the mean value of all obtained alignment position deviation, and V is the value representative for the spread in the set of alignment position deviations. In this example, the value increases with increasing alignment mark deformation. It is also possible to obtain a value, e.g., $V'=1/V$, which decreases with increasing alignment mark deformation.

Once the level of alignment mark deformation is estimated, this information can advantageously be used in predicting the position of every desired point on the substrate more accurately. However, this can be done in different ways.

A simple way is to ignore the alignment marks having too much alignment mark deformation. One simply has to determine a threshold to distinguish between minimally deformed alignment marks and highly deformed alignment marks, compare the value V with this threshold and ignore the alignment position deviation of alignment marks which are highly deformed in the determination of the wafer deformation, thereby improving the accuracy of the determined wafer deformation relative to the case in which all alignment marks, including highly deformed alignment marks, are used.

A practical implementation can be to weight the alignment position deviation with a weighing factor according to the following rules if the value V increases with increasing alignment mark deformation:
Weighing factor=0 if value V is above a predetermined threshold; and
Weighing factor=1 if value V is below a predetermined threshold.

In case the value V' decreases with increasing alignment mark deformation, the rules change accordingly into:
Weighing factor=1 if value V' is above a predetermined threshold; and
Weighing factor=0 if value V' is below a predetermined threshold.

The inverse of the value V (=1/V) may also be used as a continuous weighing factor when applying the alignment position deviation in an alignment model, such that more deformed alignment marks have less of a contribution then less deformed alignment marks. When needed, the weighing factor may be normalized before being applied in the alignment model.

The value V or V' may also be used as an alarm to the non-lithographic process control to indicate that the non-lithographic process causes alignment mark deformation.

In an embodiment, the weighing factor is dependent on the signal intensity of the preferred measuring frequency, such that alignment position information associated with an alignment mark having a low signal intensity may be ignored or its effect in the predicting model may be reduced, because a low signal intensity indicates that it may not be possible to determine the alignment position with enough accuracy.

In an embodiment, for each alignment mark a shape factor is determined representative for the undesired scattering of light from the alignment mark, and wherein the weighing factor is also dependent on the shape factor.

In an embodiment, the weighing factor is dependent on an alignment mark deformation distribution, preferably by being dependent on the sum of the ratio between the distance to other alignment marks and the value of the other alignment marks divided by the value of the alignment mark the weighing factor is determined for.

The weighing factor may thus be more complex and also depend on other measured parameters, e.g.,:

$$Wi = Twq,i * Tmcc,i * Pi;$$

where Wi is the weighing factor, Twq,i is dependent on signal intensity, Tmcc,i is dependent on shape factor and Pi is dependent on the value V or V' for alignment mark deformation, and wherein all variables relate to alignment mark i.

In eventually determining the alignment position and alignment position deviation for use in a position predicting model, the preferred measuring frequency having the largest signal intensity may be used. However, even in case multiple measuring frequencies are used, the signal intensity of the preferred measuring frequency may still be too weak to determine the alignment position accurate enough. In such case Twq,i for the alignment mark may be set to zero in order to ignore the alignment mark data.

The shape factor is dependent on the quality of the grating itself, and thus how well the grating is able to provide a diffracted light beam which allows to determine the alignment position accurate enough, i.e., the shape quality provides information about the amount of undesired scattering of the alignment mark. If the shape factor is too poor, Tmcc,i can be set to zero in order to ignore the alignment mark data.

Pi may be determined by the inverse of the value V representative for the alignment mark deformation, but in an alternative embodiment, Pi may be determined by the following equation:

$$Pi = \frac{\sum_{k=1 \ldots n} \frac{d_{ki}}{V_k}}{V_i}$$

where $d_{ki}$ is the distance from alignment mark k to alignment mark I for which the weighing factor is determined. $V_k$ is the value representative for the alignment mark deformation for alignment mark k and $V_i$ is the value representative for the alignment mark deformation for alignment mark i. In fact Pi is determined by looping over other, preferably all, alignment marks and calculate the sum of the ratio between distance and value V per mark and subsequently dividing by the value V for the mark itself. In this way, if nearby alignment marks have less alignment mark deformation, the weighing factor is decreased and if nearby alignment marks have large alignment mark deformation, the weighing factor is increased. The advantage is that the alignment mark deformation distribution over the wafer is taken into account when determining the weighing factor. The weighing factor probably needs normalization before it can be applied in an alignment model.

The alignment position deviations including weighing factor may be used to predict the position of every desired point on the substrate by inputting them into an alignment model, i.e., a position predicting model. The position predicting model may use radial basis functions for function approximation and interpolation of scattered data in many directions.

The weighing factor is described above as a discrete parameter which is either zero or one depending on the conditions. However, it is also possible to determine the weighing factor as a continuous parameter which can have any value between zero and one, thereby reducing the effect of the associated alignment mark position information in the position predicting model.

It is to be understood that the application of the weighing factor may be independent of the way the level of alignment mark deformation is determined. Hence, the level of alignment mark deformation may be determined using other sensors or other principles.

The above described values which are representative for the spread in the set of alignment position deviations, i.e., the alignment mark displacements, and thus representative for the level of mark deformation can also be used to estimate a mathematical relationship between values and overlay error, so that the overlay error induced by the alignment mark deformation can be compensated or at least reduced.

However, the relationship between alignment mark deformation and overlay error may also be estimated by using other values representative for the alignment mark deformation of an alignment mark. An example thereof is the difference between two alignment position deviations obtained using two different measuring frequencies.

As the by an alignment mark diffracted radiation comprises multiple diffraction orders, a single alignment sensor may be able to determine an alignment mark position, and thus alignment mark deviation for each detectable order, so that a difference between alignment mark deviations determined using different diffraction orders can also be used as a value representative for alignment mark deformation.

It is thus possible to determine an alignment position deviation, i.e., alignment mark displacement, and at the same time determine one or more mark deformation values associated with each measured alignment mark, which values are representative for the level of alignment mark deformation of the alignment mark. These values can be used as described below.

As mentioned before, it is thus possible to use multiple values that may be or are representative for the level of alignment mark deformation. When using multiple values, some values may be more representative than other values. In fact it is possible that some values are not representative for the alignment mark deformation at all. Hence, it may be preferable to determine first which value or values are most representative for the alignment mark deformation and which value or values are least representative for the alignment mark deformation. In this way, the amount of values used in subsequent method steps may be reduced which may reduce the required computational power and time.

The lithographic apparatus of FIG. 1, or any similar device, can be used to transfer a first pattern to a substrate, wherein the first pattern includes at least N alignment marks, wherein each alignment mark has a respective predefined nominal position within the first pattern.

After transferring the first pattern, the substrate may be removed from the lithographic apparatus and processed as part of a manufacturing process. These processes may be the cause of substrate deformation and alignment mark deformation.

In order to properly align a second pattern relative to the first pattern, the position of N alignment marks is measured using an alignment sensor as described above. Using the information obtained from the alignment sensor system, at least one mark deformation value is determined for each of the N alignment marks which is representative for the level of alignment mark deformation of the alignment mark.

The measured positions of the N alignment marks are used to determine an alignment mark displacement, i.e., an alignment position deviation, for each of the N alignment marks by comparing the respective nominal position of the an alignment mark with the respective measured position of the alignment mark.

The alignment mark displacement can not be used directly to transfer the second pattern to the substrate and aligning the second pattern with respect to the first pattern. The determined alignment mark displacements are therefor fitted to a first model. An example of such a first model is a six parameter linear model in which the displacement is described in terms of translation, magnification and rotation. For each measurement of one alignment mark, the following equations can be formed:

$$Mx \cdot xc - Ry \cdot yc + Cx = dx$$

$$Rx \cdot xc + My \cdot yc + Cy = dy$$

where xc en yc are the coordinates of the nominal position where the measurement is done, Cx is a translation in x-direction, Cy is a translation in y-direction, Mx is a magnification in x-direction, My is a magnification in y-direction, Rx is a rotation of the x-axis about the z-axis, Ry is a rotation of the y-axis about the z-axis, and dx, dy are the displacement of the alignment mark from the nominal position in respectively the x- and y-direction.

Writing these equations for every mark on the substrate leads to the following system:

$$\begin{bmatrix} dx_i \\ dy_i \end{bmatrix} = \begin{bmatrix} 1 & xc_i & -yc_i & 0 & 0 & 0 \\ 0 & 0 & 0 & 1 & yc_i & xc_i \end{bmatrix} \begin{bmatrix} Cx \\ Mx \\ Rx \\ Cy \\ My \\ Ry \end{bmatrix}$$

$$i = 1, \ldots, N$$

In matrix vector notations it looks like $A \cdot \bar{x} = \bar{b}$ and matrix A has size 2N×6, where N is the number of alignment marks used.

To be able to find the model parameters to fit (Cx, Cy, Mx, My, Rx and Ry) at least 6 of these equations (i.e., 3 measurements) are needed. Normally, more measurements than parameters are available. This leads to solving an over-determined system of equations where the matrix has more rows than columns. A solution of these equations can be found using the well-known Least Square Method. This can be written as $\bar{x} = (A^T A)^{-1} A^T \bar{b}$.

Hence, six alignment model parameters (Cx, Cy, Mx, My, Rx and Ry) are determined for the substrate which can be used to transfer the second pattern to the substrate such that the second pattern is aligned relative to the first pattern. Other models, such as higher order models, radial base functions, etc., may also be used as first model. However, this example will continue to use the six parameter linear model to elucidate the method.

When reference is made to a model, such as the abovementioned first model, reference is made to the unfitted model. If the model has been fitted to measurement data, the model will be referred to as the fitted model, which actually refers to the determined model parameters which are the result of the model fit.

In order to determine how successful the alignment between two subsequently transferred patterns was, i.e., in order to determine the overlay between two subsequently transferred patterns, both patterns may be provided with corresponding overlay marks, so that the position of an overlay mark in one pattern can be measured relative to a corresponding overlay mark of the other pattern.

Overlay is expressed in terms of overlay error, which expresses the deviation of a point in one of the patterns from a desired alignment with a corresponding point in another layer. Consequently, perfect overlay results in a zero overlay error, and non-zero overlay errors indicate that the overlay is not as desired. A non-zero overlay error may for instance result from the following error sources.

measurement error in the measuring of the position of an alignment mark, e.g., process induced errors, such as alignment mark deformation, etc.;

placement error in placing the alignment mark at the nominal position, e.g., due to random variations in temperature, pressure, etc.; and measurement error in measuring the overlay error, which can be split into placement error in placing the overlay marks and measurement error in measuring the position of an overlay mark in one pattern relative to a corresponding overlay mark in the other pattern.

An overlay error can be measured at multiple distinct locations across the substrate.

In order to estimate a relationship between the one or more mark deformation values and the overlay errors, the one or more deformation values and the overlay errors are each fitted to the same first model as the alignment mark displacements. In this example, the one or more deformation values and overlay errors are thus fitted to the six parameter linear model described above.

For each of the N alignment marks, the following equations can be formed for a first mark deformation value representative for the level of alignment mark deformation of the corresponding alignment mark:

$$Mx_{ASI1} \cdot xc - Ry_{ASI1} \cdot yc + Cx_{ASI1} = ASI1_x$$

$$Rx_{ASI1} \cdot xc - My_{ASI1} \cdot yc + Cy_{ASI1} = ASI1_y$$

where xc en yc are the coordinates of the nominal position of the alignment mark, $Cx_{ASI1}$ is a translation in x-direction, $Cy_{ASI1}$ is a translation in y-direction, $Mx_{ASI1}$ is a magnification in x-direction, $My_{ASI1}$ is a magnification in y-direction, $Rx_{ASI1}$ is a rotation of the x-axis about the z-axis, $Ry_{ASI1}$ is a rotation of the y-axis about the z-axis, and $ASI1_x$, $ASI1_y$ are the first mark deformation values of the alignment mark in respectively the x- and y-direction.

Writing these equations for every mark on the substrate leads to the following system:

$$\begin{bmatrix} ASI1_{x,i} \\ ASI1_{y,i} \end{bmatrix} = \begin{bmatrix} 1 & xc_i & -yc_i & 0 & 0 & 0 \\ 0 & 0 & 0 & 1 & yc_i & xc_i \end{bmatrix} \begin{bmatrix} Cx_{ASI1} \\ Mx_{ASI1} \\ Rx_{ASI1} \\ Cy_{ASI1} \\ My_{ASI1} \\ Ry_{ASI1} \end{bmatrix}$$

$$i = 1, \ldots, N$$

In matrix vector notations it looks like $A \cdot \bar{x} = \bar{b}$ and matrix A has size 2N×6, where N is the number of alignment marks used.

The same can be done for a different second mark deformation value also representative for the level of alignment mark deformation of the alignment mark, resulting in the following system:

$$\begin{bmatrix} ASI2_{x,i} \\ ASI2_{y,i} \end{bmatrix} = \begin{bmatrix} 1 & xc_i & -yc_i & 0 & 0 & 0 \\ 0 & 0 & 0 & 1 & yc_i & xc_i \end{bmatrix} \begin{bmatrix} Cx_{ASI2} \\ Mx_{ASI2} \\ Rx_{ASI2} \\ Cy_{ASI2} \\ My_{ASI2} \\ Ry_{ASI2} \end{bmatrix}$$

$$i = 1, \ldots, N$$

where xc en yc are the coordinates of the nominal position of the respective alignment mark, $CX_{ASI2}$ is a translation in x-direction, $Cy_{ASI2}$ is a translation in y-direction, $Mx_{ASI2}$ is a magnification in x-direction, $My_{ASI2}$ is a magnification in y-direction, $Rx_{ASI2}$ is a rotation of the x-axis about the z-axis, $Ry_{ASI2}$ is a rotation of the y-axis about the z-axis, and $ASI2_x$, $ASI2_y$ are the second mark deformation values of the respective alignment mark in respectively the x- and y-direction.

In a similar fashion fitting the first model to the determined overlay errors associated with K overlay marks results in the following system:

$$\begin{bmatrix} OV_{x,j} \\ OV_{y,j} \end{bmatrix} = \begin{bmatrix} 1 & xo_j & -yo_j & 0 & 0 & 0 \\ 0 & 0 & 0 & 1 & yo_j & xo_j \end{bmatrix} \begin{bmatrix} Cx_{OV} \\ Mx_{OV} \\ Rx_{OV} \\ Cy_{OV} \\ My_{OV} \\ Ry_{OV} \end{bmatrix}$$

$$j = 1, \ldots, K$$

where xo en yo are the coordinates of the nominal position of the respective overlay mark, $Cx_{OV}$ is a translation in x-direction, $Cy_{OV}$ is a translation in y-direction, $Mx_{OV}$ is a magnification in x-direction, $My_{OV}$ is a magnification in y-direction, $Rx_{OV}$ is a rotation of the x-axis about the z-axis, $Ry_{OV}$ is a rotation of the y-axis about the z-axis, and $OV_x$, $OV_y$ are the overlay errors of the respective overlay mark in respectively the x- and y-direction.

The result of the modeling is that for the substrate the following model parameters are obtained:

A set of first mark deformation model parameters describing the distribution of the first mark deformation values across the substrate:

$Cx_{ASI1}$, $Cy_{ASI1}$, $Mx_{ASI1}$, $My_{ASI1}$, $Rx_{ASI1}$ and $Ry_{ASI1}$

A set of second mark deformation model parameters describing the distribution of the second mark deformation values across the substrate:

$Cx_{ASI2}$, $Cy_{ASI2}$, $Mx_{ASI2}$, $My_{ASI2}$, $Rx_{ASI2}$ and $Ry_{ASI2}$

A set of overlay error model parameters describing the distribution of the overlay error across the substrate:

$Cx_{OV}$, $Cy_{OV}$, $Mx_{OV}$, $My_{OV}$, $Rx_{OV}$ and $Ry_{OV}$

In order to determine a relationship between the overlay error model parameters and the first and second mark deformation model parameters, each overlay error model parameter may be written as a function of corresponding first and second mark deformation model parameters. An example for the translation parameter in x and a linear relationship yields:

$$Cx_{OV} = a1_{cx} + a2_{cx} \cdot Cx_{ASI1} + a3_{cx} \cdot Cx_{ASI2}$$

This yields three parameters which can not be solved by a single equation, so that the above described method is repeated for two other substrates and each substrate has a set of first mark deformation model parameters, a set of second mark deformation model parameters and a set of overlay error model parameters and the following system of three equations can be formed:

$$Cx_{OV,1} = a1_{cx} + a2_{cx} \cdot Cx_{ASI1,1} + a3_{cx} \cdot Cx_{ASI2,1}$$

$$Cx_{OV,2} = a1_{cx} + a2_{cx} \cdot Cx_{ASI1,2} + a3_{cx} \cdot Cx_{ASI2,2}$$

$$Cx_{OV,3} = a1_{cx} + a2_{cx} \cdot Cx_{ASI1,3} + a3_{cx} \cdot Cx_{ASI2,3}$$

which system can be solved to find the parameters $a1_{cx}$, $a2_{cx}$, and $a3_{cx}$. The same can be done for the translation in y (Cy), the magnification in x (Mx), the magnification in y (My), the rotation in x (Rx) and the rotation in y (Ry), thereby obtaining the full relationship between the overlay errors and the first and second mark deformation values.

Hence, the number M of substrates used for this method depends on the amount of parameters that have to be calculated to determine the mentioned relationships. For instance, using one mark deformation value requires at least two substrates, two mark deformation values requires at least three substrates, and in general, using P mark deformation values requires at least P+1 substrates.

If not enough substrates are available for finding the relationship between the mark deformation values and the overlay errors, the amount of parameters and thus the required number of substrates may be reduced by first fitting the mark deformation values separately to the overlay error in order to estimate the mark deformation values which are most representative for the alignment mark deformation and subsequently use these mark deformation values only to find the relationship between mark deformation values and overlay errors. Other selection mechanisms may also be used to reduce the number of used mark deformation values. The selection mechanism may be part of a self-learning aspect of the invention.

It is to be noted here that the example uses a specific first model, two mark deformation values and a linear relationship between the overlay errors and the mark deformation values, but the first model may be a different model, the number of mark deformation values may be any integer value starting from 1, and the linear relationship may be replaced by any other suitable relationship. In fact, multiple relationships may be readily available, wherein the method comprises the step of determining which relationship is able to best describe the relationship between mark deformation values and overlay errors. Hence, the method may comprise a selection mechanism for determining which mark deformation values represent the alignment mark deformation the best and/or a separate selection mechanism for determining which relationship is able to best describe the relationship between mark deformation values and overlay errors.

When one continuously transfers first and second patterns to substrates, the determined relationship between the overlay errors and the one or more mark deformation values may be regularly updated or adapted to incorporate slowly changing process variations.

The relationship between overlay errors and mark deformation values can be used to reduce the overlay error for subsequent substrates by calculating at least one alignment model parameter compensation value based on the relationship between the obtained first and second mark deformation model parameters and the obtained overlay error model parameters. For the above example, the alignment model parameter compensation value for the translation in x may be calculated using the following equation:

$$\Delta Cx = a2_{cx} \cdot Cx_{AS/1} + a3_{cx} \cdot Cx_{AS/2}$$

When transferring the second pattern to the substrate, use can now be made of the alignment model parameter $Cx - \Delta Cx$ instead of $Cx$ as was previous done, thereby intending to compensate for the overlay error induced by alignment mark deformation. This can be done for every alignment model parameter.

In the above described embodiments, reference may be made to for instance each alignment mark, wherein each is meant to be every alignment mark in a chosen set of alignment marks. Hence, it is possible that the substrate is provided with more alignment marks which are not used in the method. This interpretation of each also applies to other entities than the alignment mark where appropriate and is thus not limiting the invention.

It is further mentioned here that the abovementioned alignment sensor system allowing to measure at different measuring frequencies may be embodied as a single alignment sensor able to emit light at different wavelengths or may be embodied as a combination of separate alignment sensors, each sensor configured to emit light at a wavelength different from the other sensors. Independent of the number of alignment sensors, the detectors for detecting diffraction patterns in the from the alignment mark reflected light may also be embodied as a single detector used for all wavelengths or may be embodied as separate detectors, each detector being used for one or more wavelengths, preferably for one wavelength only.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The subject-matter described above may alternatively be summarized by the following clauses:

1. A method to estimate the level of alignment mark deformation on a processed substrate using an alignment system with multiple alignment sensors that are each able to emit light at a measuring frequency different from the other alignment sensors to reflect from an alignment mark on the substrate and to detect a diffraction pattern in the reflected light in order to measure an alignment position of the alignment mark, the method comprising the following steps:

a) providing a substrate with multiple alignment marks, wherein each alignment mark is provided in a predetermined alignment position;

b) processing the substrate;

c) for each alignment mark, measuring an alignment position after processing of the substrate using two or more alignment sensors of the alignment system, wherein each alignment sensor:

d) emits light at its own measuring frequency towards the alignment mark;

e) detects a diffraction pattern in the from the alignment mark reflected light; and wherein the alignment system determines an alignment position from the associated detected diffraction pattern, such that for each alignment mark a set of alignment positions is obtained corresponding to the two or more alignment sensors of the alignment system, and wherein the method further comprises the following steps:

f) for each alignment mark, determining an alignment position deviation for each alignment position of the set of alignment positions by comparing the alignment positions with the predetermined alignment position, thereby obtaining a set of alignment position deviations per alignment mark;

g) for each alignment mark, determining a value which is representative for the spread in the set of alignment position deviations to estimate the level of deformation of the alignment mark.

2. A method according to clause 1, wherein the value representative for the spread in the obtained alignment position deviations is the variance of the set of alignment position deviations.

3. A method according to clause 1, wherein the value representative for the spread in the obtained alignment position deviations is the standard deviation of the set of alignment position deviations.

4. A method according to clause 1, wherein the alignment position is measured using three, four or more alignment sensors.

5. A method to predict the position of every point on a processed substrate, the method comprising the following steps.

a) providing a substrate with multiple alignment marks, wherein each alignment mark is provided in a predetermined alignment position;

b) processing the substrate;

c) for each alignment mark, measuring an alignment position after processing of the substrate;

d) for each alignment mark, determining an alignment position deviation by comparing the measured alignment position with the predetermined alignment position;

e) for each alignment mark, determining a value representative for the level of alignment mark deformation; and f) for each alignment mark, determining a weighing factor based on the value, such that the weighing factor is high for alignment marks having minimal alignment mark deformation and low for alignment marks having a relatively large alignment mark deformation; and g) predicting the position of every point on the substrate by applying a position predicting model having the weighed alignment position deviations as input.

6. A method according to clause 5, wherein use is made of an alignment system with multiple alignment sensors that are each able to emit light at a measuring frequency different from the other alignment sensors to reflect from an alignment mark on the substrate and to detect a diffraction pattern in the reflected light in order to measure an alignment position of the alignment mark, and wherein the alignment position of each alignment mark after processing of the substrate is measured using two or more alignment sensor of the alignment system, wherein each alignment sensor:

emits light at its own measuring frequency towards the alignment mark;

detects a diffraction pattern in the from the alignment mark reflected light;

wherein the alignment system determines a preferred alignment sensor for each alignment mark that gives the best result, e.g., has the largest signal intensity, and wherein the alignment system determines an alignment position from the detected diffraction pattern associated with the preferred alignment sensor.

7. A method according to clause 5, wherein use is made of an alignment system with multiple alignment sensors that are each able to emit light at a measuring frequency different from the other alignment sensors to reflect from an alignment mark on the substrate and to detect a diffraction pattern in the reflected light in order to measure an alignment position of the alignment mark, and wherein the alignment position of each alignment mark after processing of the substrate is measured using two or more alignment sensor of the alignment system, wherein each alignment sensor:

emits light at its own measuring frequency towards the alignment mark;

detects a diffraction pattern in the from the alignment mark reflected light;

wherein the alignment system determines an alignment position from the associated detected diffraction pattern, such that for each alignment mark a set of alignment positions is obtained corresponding to the two or more alignment sensors of the alignment system, and wherein for each alignment mark, an alignment position deviation is determined for each alignment position of the set of alignment positions by comparing the alignment positions with the predetermined alignment position, thereby obtaining a set of alignment position deviations per alignment mark and wherein the alignment system determines a preferred alignment sensor for each alignment mark that gives the best result, e.g., has the largest signal intensity, wherein the information of the preferred alignment sensor is used to determine the alignment position and alignment position deviation for the alignment mark, and wherein the value representative for the level of mark deformation is determined by determining a value which is representative for the spread in the set of alignment position deviations to estimate the level of deformation of the alignment mark.

8. A method according to clause 5, wherein in case of a value that increases with increasing alignment mark deformation, on a scale of zero to one, the weighing factor is zero when the value is above a predetermined threshold and is one when the value is below the predetermined threshold, and wherein in case of a value that decreases with increasing alignment mark deformation, the weighing factor is one when the value is above a predetermined threshold and is zero when the value is below the predetermined threshold.

9. A method according to clause 6 or 7, wherein the weighing factor is also dependent on the signal intensity of the preferred alignment sensor, wherein preferably the weighing factor is zero when the intensity is below a predetermined threshold and one when the intensity is above the predetermined threshold.

10. A method according to clause 6 or 7, wherein for each alignment mark a shape factor is determined representative for the undesired scattering of light from the alignment mark, and wherein the weighing factor is also dependent on the shape factor, wherein preferably the weighing value is zero when the undesired scattering of light is above a predetermined threshold and one when the scattering of light is below the predetermined threshold.

11. A method according to clause 5, wherein the weighing factor is dependent on an alignment mark deformation distribution, preferably by being dependent on the sum of the ratio between the distance to other alignment marks and the value of the other alignment marks divided by the value of the alignment mark the weighing factor is determined for.

12. An alignment system comprising multiple alignment sensors, each being provided with a light source to emit light at a measuring frequency different from the other alignment sensors towards an alignment mark on a substrate, and a detector to detect a diffraction pattern in light reflected from the alignment mark, the alignment system further being provided with a processing unit in connection with the detectors of the multiple alignment sensors and configured to perform at least the method steps f) and g) of clause 1.

13. An alignment system according to clause 12, wherein the processing unit is configured to perform at least the method steps f) and g) of clause 5.

14. An alignment system according to clause 12, wherein two or more alignment sensors share a common detector.

15. A lithographic apparatus comprising an alignment system according to clause 12.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method to estimate a value representative for a level of alignment mark deformation on a processed substrate using an alignment system comprising an alignment sensor system that is able to emit light at different measuring frequencies to reflect from an alignment mark on the substrate and to detect a diffraction pattern in the reflected light in order to measure an alignment position of the alignment mark, the method comprising:
    providing a substrate with N alignment marks, wherein each alignment mark is provided in a predetermined alignment position;
    processing the substrate;
    for each of the N alignment marks, measuring an alignment position after processing of the substrate using the alignment sensor system, wherein the light is emitted at the respective two or more measuring frequencies towards the alignment mark;
    for each of the two or more measuring frequencies, detecting a corresponding diffraction pattern from the alignment mark reflected light;
    determining an alignment position from the detected two or more diffraction patterns, such that for each of the N alignment marks a set of alignment positions is obtained corresponding to the two or more measuring frequencies of the alignment sensor system;
    for each of the N alignment marks, determining an alignment position deviation for each alignment position of the set of alignment positions by comparing the alignment positions with the predetermined alignment position, thereby obtaining a set of alignment position deviations per alignment mark;
    for each of the N alignment marks, determining a value which is representative for a spread in the set of alignment position deviations to estimate the level of deformation of the alignment mark; and
    for each of the N alignment marks, determining a weighing factor based on the value, such that the weighing factor is high for alignment marks having minimal alignment mark deformation and low for alignment marks having a relatively large alignment mark deformation.

2. The method according to claim 1, wherein the value representative for the spread in the obtained alignment position deviations is a variance or a standard deviation of the set of alignment position deviations.

3. A method, comprising:
    providing a substrate with N alignment marks, wherein each alignment mark is provided in a predetermined alignment position;
    processing the substrate;
    for each of the N alignment marks, measuring an alignment position after processing of the substrate;
    for each of the N alignment marks, determining an alignment position deviation by comparing the measured alignment position with a predetermined alignment position;
    for each of the N alignment marks, determining a value representative for a level of alignment mark deformation;
    for each of the N alignment marks, determining a weighing factor based on the value, such that the weighing factor is high for alignment marks having minimal alignment mark deformation and low for alignment marks having a relatively large alignment mark deformation; and predicting a position of a desired point on the substrate by applying a position predicting model having the weighed alignment position deviations as input.

4. The method according to claim 3, wherein an alignment system is used, the alignment system comprising an alignment sensor system configured to emit light at different measuring frequencies, wherein for two or more measuring frequencies:
- emitting light at the respective two or more measuring frequencies towards each of the N alignment marks;
- for each of the two or more measuring frequencies, detecting a corresponding diffraction pattern from the alignment mark reflected light;
- determining a preferred measuring frequency for each of the N alignment marks that has largest signal intensity; and
- determining, for each of the N alignment marks, the alignment position from the detected diffraction pattern associated with the preferred measuring frequency.

5. The method according to claim 3, wherein an alignment system is used, the alignment system comprising an alignment sensor system configured to emit light at different measuring frequencies, wherein for two or more measuring frequencies the method further comprises:
- emitting light at the respective two or more measuring frequencies towards each of the N alignment marks;
- for each of the two or more measuring frequencies, detecting a corresponding diffraction pattern from the alignment mark reflected light;
- determining the alignment position from the detected two or more diffraction patterns, such that for each of the N alignment marks a set of alignment positions is obtained corresponding to the two or more measuring frequencies of the alignment sensor system;
- for each of the N alignment marks, determining the alignment position deviation by comparing the alignment positions with the predetermined alignment position, thereby obtaining a set of alignment position deviations per alignment mark; and
- determining a preferred measuring frequency for each of the N alignment marks that has largest signal intensity, wherein the information of the preferred measuring frequency is used to determine the alignment position and alignment position deviation for the alignment mark,
- wherein the determining value representative for the level of mark deformation comprises determining a value which is representative for the set of alignment position deviations to estimate the level of deformation of the alignment mark.

6. The method according to claim 3, wherein in case of a value that increases with increasing alignment mark deformation, on a scale of zero to one, the weighing factor is zero when the value is above a predetermined threshold and is one when the value is below the predetermined threshold, and wherein in case of a value that decreases with increasing alignment mark deformation, the weighing factor is one when the value is above a predetermined threshold and is zero when the value is below the predetermined threshold.

7. The method according to claim 4, wherein the weighing factor is also dependent on signal intensity of the preferred measuring frequency, wherein the weighing factor is zero when the intensity is below a predetermined threshold and one when the intensity is above the predetermined threshold.

8. The method according to claim 4, wherein for each of the N alignment marks a shape factor is determined representative of undesired scattering of light from the respective alignment mark, and wherein the weighing factor is also dependent on the shape factor, wherein the weighing factor is zero when the undesired scattering of light is above a predetermined threshold and one when the scattering of light is below the predetermined threshold.

9. The method according to claim 3, wherein the weighing factor is dependent on an alignment mark deformation distribution, by being dependent on a sum of a ratio between a distance to other alignment marks and a value of the other alignment marks divided by the value of the alignment mark the weighing factor is determined for.

10. An alignment system comprising:
- an alignment sensor system provided with multiple light sources and configured to emit light at different measuring frequencies towards an alignment mark on a substrate;
- at least one detector configured to detect a diffraction pattern in light reflected from the alignment mark;
- a processing unit in connection with the at least one detector of the alignment sensor system and configured to:
  - provide a substrate with N alignment marks, wherein each alignment mark is provided in a predetermined alignment position;
  - process the substrate;
  - for each of the N alignment marks, measure an alignment position after processing of the substrate using the alignment sensor system, wherein light is emitted at the respective two or more measuring frequencies towards the alignment mark;
  - for each of the two or more measuring frequencies, detect a corresponding diffraction pattern from the alignment mark reflected light;
  - determine an alignment position from the detected two or more diffraction patterns, such that for each of the N alignment marks a set of alignment positions is obtained corresponding to the two or more measuring frequencies of the alignment sensor system;
  - for each of the N alignment marks, determine an alignment position deviation for each alignment position of the set of alignment positions by comparing the alignment positions with the predetermined alignment position, thereby obtaining a set of alignment position deviations per alignment mark;
  - for each of the N alignment marks, determine a value which is representative for a spread in the set of alignment position deviations to estimate the level of deformation of the alignment mark; and
  - for each of the N alignment marks, determine a weighing factor based on the value, such that the weighing factor is high for alignment marks having minimal alignment mark deformation and low for alignment marks having a relatively large alignment mark deformation.

11. The alignment system according to claim 10, wherein the alignment system is comprised in a lithography system.

12. A method comprising the following steps:
- providing M substrates, wherein M is at least two;
- transferring a first pattern to each of the M substrates, the first pattern including at least N alignment marks, wherein each alignment mark has a respective predefined nominal position within the first pattern, and wherein N is at least two;
- processing the M substrates;
- for each substrate, measuring a position of N alignment marks;

determining a first mark deformation value for each of the measured alignment marks that is representative for a level of alignment mark deformation of the corresponding alignment mark;

determining an alignment mark displacement for each of the measured alignment marks by comparing the respective nominal position of an alignment mark with the respective measured position of the alignment mark;

for each substrate, fitting a first model to the N alignment mark displacements to obtain at least one alignment model parameter per substrate;

transferring a second pattern to each of the M substrates using the respective at least one alignment model parameter in order to align the second pattern with respect to the first pattern;

for each substrate, measuring at least two overlay errors by measuring a relative position of the first pattern with respect to the second pattern at distinct locations on the substrate, wherein an overlay error is representative for a displacement of the second pattern relative to a desired alignment between first and second pattern at the respective location;

for each substrate, fitting the first model to the respective N first mark deformation values to obtain at least one first mark deformation model parameter per substrate;

for each substrate, fitting the first model to the respective multiple overlay errors to obtain at least one overlay error model parameter per substrate; and determining a relationship between the obtained first mark deformation model parameters and the obtained overlay error model parameters in order to determine a relationship between first mark deformation values and overlay errors.

13. The method according to claim 12, wherein the relationship between the obtained first mark deformation model parameters and the obtained overlay error model parameters is found by solving a set of equations, wherein each equation defines an overlay error model parameter as a function of a corresponding first mark deformation model parameter.

14. The method according to claim 12, further comprising:

determining a second mark deformation value for each of the measured alignment marks that is representative for the level of alignment mark deformation of the corresponding alignment mark, wherein the determination of the second mark deformation value is based on other information than the determination of the first mark deformation value;

for each substrate, fitting the first model to the respective N second mark deformation values to obtain at least one second mark deformation model parameter per substrate; and determining a relationship between the obtained first and second mark deformation model parameters and the obtained overlay error model parameters in order to determine a relationship between first and second mark deformation values and overlay errors.

15. The method according to claim 12, wherein the relationship between the obtained first and second mark deformation model parameters and the obtained overlay error model parameters is found by solving a set of equations, wherein each equation defines an overlay error model parameter as a function of a corresponding first mark deformation model parameter and a corresponding second mark deformation model parameter.

16. The method according to claim 13, wherein M is larger than the number of parameters of the set of equations, and wherein N is larger than the number of parameters of the first model.

17. The method according to claim 12, further comprising:

calculating at least one alignment model parameter compensation value based on the relationship between the obtained first mark deformation model parameters and the obtained overlay error model parameters to compensate for mark deformation induced overlay errors;

transferring a first pattern to a further substrate, the first pattern including at least N alignment marks, wherein each alignment mark has a respective predefined nominal position within the first pattern;

processing the further substrate;

measuring a position of N alignment marks on the further substrate;

determining an alignment mark displacement for each of the N measured alignment marks of the further substrate by comparing the respective nominal position of an alignment mark with the respective measured position of the alignment mark;

fitting the first model to the N alignment mark displacements of the further substrate to obtain at least one alignment model parameter associated with the further substrate;

combining the at least one alignment model parameter with the at least one calculated alignment model parameter compensation value to obtain at least one compensated alignment model parameter; and transferring a second pattern to the further substrate using the at least one compensated alignment model parameter in order to align the second pattern with respect to the first pattern.

* * * * *